United States Patent
Monro

(10) Patent No.: US 7,586,424 B2
(45) Date of Patent: Sep. 8, 2009

(54) DATA CODING USING AN EXPONENT AND A RESIDUAL

(76) Inventor: Donald Martin Monro, 6, The Lays, Goose Street, Beckington, Somerset, BA11 6RS (GB)

( * ) Notice: Subject to any disclaimer, the term of this patent is extended or adjusted under 35 U.S.C. 154(b) by 242 days.

(21) Appl. No.: 11/422,316

(22) Filed: Jun. 5, 2006

(65) Prior Publication Data

US 2007/0282933 A1  Dec. 6, 2007

(51) Int. Cl.
*H03M 7/34* (2006.01)
(52) U.S. Cl. .................. 341/51; 341/50; 341/65; 341/67; 341/107; 708/203
(58) Field of Classification Search .......... 341/51, 341/65, 67, 107; 708/203
See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 4,558,302 A | 12/1985 | Welch | |
| 4,675,809 A | 6/1987 | Omoda et al. | |
| 4,908,873 A | 3/1990 | Philbert et al. | |
| 5,218,435 A | 6/1993 | Lim et al. | |
| 5,315,670 A | 5/1994 | Shapiro | |
| 5,321,776 A | 6/1994 | Shapiro | |
| 5,412,741 A | 5/1995 | Shapiro | |
| 5,559,931 A | 9/1996 | Shindou et al. | |
| 5,635,932 A | 6/1997 | Shinagawa et al. | |
| 5,699,121 A | 12/1997 | Zakhor et al. | |
| 5,748,786 A | 5/1998 | Zandi et al. | |
| 5,754,704 A | 5/1998 | Barnsley et al. | |
| 5,768,437 A | 6/1998 | Monro et al. | |
| 5,819,017 A * | 10/1998 | Akeley et al. | 345/422 |
| 5,873,076 A | 2/1999 | Barr et al. | |
| 5,956,429 A * | 9/1999 | Burns | 382/245 |
| 6,029,167 A | 2/2000 | Evans | |
| 6,052,416 A | 4/2000 | Koga | |
| 6,078,619 A | 6/2000 | Monro et al. | |
| 6,086,706 A | 7/2000 | Brassil et al. | |
| 6,125,348 A * | 9/2000 | Levine | 704/500 |

(Continued)

FOREIGN PATENT DOCUMENTS

EP  0 595 599 A2  5/1994

(Continued)

OTHER PUBLICATIONS

Brin et al., Copy detection mechanisms for digital documents, Proceedings of the 1995 ACM SIGMOD international conference on Management of data SIGMOD '95, Volumer 24 ACM Press, May 1995, pp. 398-409.

(Continued)

*Primary Examiner*—Khai M Nguyen
(74) *Attorney, Agent, or Firm*—Sterne, Kessler, Goldstein & Fox P.L.L.C.

(57) ABSTRACT

A method of coding audio and/or video data. A data symbol may be coded using an exponent and a residual, in which the exponent is coded using a variable length code, such as but not limited to a Huffman code or a Golomb code. The variable length code may be adaptive and may code according to probabilities or frequencies of occurrence of the data symbol.

34 Claims, 2 Drawing Sheets

U.S. PATENT DOCUMENTS

| | | | |
|---|---|---|---|
| 6,144,835 | A | 11/2000 | Inoue |
| 6,208,744 | B1 | 3/2001 | Ishige et al. |
| 6,336,050 | B1 | 1/2002 | Amin et al. |
| 6,434,542 | B1 | 8/2002 | Farmen et al. |
| 6,480,547 | B1 | 11/2002 | Chen et al. |
| 6,489,902 | B2 | 12/2002 | Heath |
| 6,522,785 | B1 | 2/2003 | Kondo et al. |
| 6,549,148 | B2 | 4/2003 | Satoh |
| 6,556,719 | B1 | 4/2003 | Monro |
| 6,563,438 | B2 | 5/2003 | Satoh |
| 6,625,213 | B2 | 9/2003 | Bottreau et al. |
| 6,654,503 | B1 | 11/2003 | Sudharsanan et al. |
| 6,661,839 | B1 | 12/2003 | Ishida et al. |
| 6,810,144 | B2 | 10/2004 | McGee et al. |
| 6,820,079 | B1 | 11/2004 | Evans |
| 6,847,966 | B1 | 1/2005 | Sommer et al. |
| 6,985,965 | B2 | 1/2006 | Hannu et al. |
| 6,990,145 | B2 | 1/2006 | Monro et al. |
| 7,003,039 | B2 | 2/2006 | Zakhor et al. |
| 7,079,986 | B2 | 7/2006 | Sieracki |
| 7,230,551 | B2 * | 6/2007 | Moriya et al. ............ 341/83 |
| 2002/0069206 | A1 | 6/2002 | Bergman et al. |
| 2002/0071594 | A1 | 6/2002 | Kool et al. |
| 2003/0108101 | A1 | 6/2003 | Frossard et al. |
| 2004/0028135 | A1 | 2/2004 | Monro |
| 2004/0126018 | A1 | 7/2004 | Monro |
| 2004/0165737 | A1 | 8/2004 | Monro |
| 2004/0218836 | A1 | 11/2004 | Kanatsu |
| 2005/0149296 | A1 | 7/2005 | Sieracki |
| 2007/0016414 | A1 | 1/2007 | Mehrotra et al. |
| 2007/0030177 | A1 | 2/2007 | Monro |
| 2007/0053434 | A1 | 3/2007 | Monro |
| 2007/0053597 | A1 | 3/2007 | Monro |
| 2007/0053603 | A1 | 3/2007 | Monro |
| 2007/0164882 | A1 | 7/2007 | Monro |
| 2007/0252733 | A1 * | 11/2007 | Thebault et al. ............ 341/67 |
| 2007/0258654 | A1 | 11/2007 | Monro |
| 2007/0271250 | A1 | 11/2007 | Monro |
| 2007/0290898 | A1 | 12/2007 | Monro |
| 2007/0290899 | A1 | 12/2007 | Monro |
| 2008/0005648 | A1 | 1/2008 | Monro |
| 2008/0055120 | A1 | 3/2008 | Monro |
| 2008/0056346 | A1 | 3/2008 | Monro |
| 2008/0084924 | A1 | 4/2008 | Monro |
| 2008/0086519 | A1 | 4/2008 | Monro |

FOREIGN PATENT DOCUMENTS

| | | | |
|---|---|---|---|
| EP | 0 836 325 A1 | | 4/1998 |
| EP | 1 545 010 A1 * | | 6/2005 |
| EP | 1 610 560 A | | 12/2005 |
| GB | 2 293 733 A | | 4/1996 |
| GB | 2 409 943 A | | 7/2005 |
| WO | WO97/16029 | | 5/1997 |
| WO | WO98/11730 | | 3/1998 |
| WO | WO99/08449 | | 2/1999 |
| WO | WO01/15456 | | 3/2001 |
| WO | WO01/63935 | | 8/2001 |
| WO | WO02/13538 | | 2/2002 |
| WO | WO2004/051863 | | 6/2004 |
| WO | WO2005/027049 | | 3/2005 |
| WO | WO 2005/064799 | * | 7/2005 |
| WO | WO 2005/067661 | | 7/2005 |
| WO | WO2005/119581 | | 12/2005 |
| WO | WO2007/030702 | | 3/2007 |
| WO | WO2007/030784 | | 3/2007 |
| WO | WO2007/030785 | | 3/2007 |
| WO | WO2007/030788 | | 3/2007 |
| WO | WO 2007/084336 | | 7/2007 |
| WO | WO 2007/118220 | | 10/2007 |
| WO | WO 2007/145875 | | 12/2007 |
| WO | WO 2007/149358 | | 12/2007 |
| WO | WO 2007/149383 | | 12/2007 |
| WO | WO 2007/149384 | | 12/2007 |
| WO | WO 2008/027450 | | 3/2008 |
| WO | WO 2008/030426 | | 3/2008 |
| WO | WO/2008/045280 | | 4/2008 |
| WO | WO/2008/045281 | | 4/2008 |

OTHER PUBLICATIONS

Cancedda et al., Word Sequence Kernels, Mar. 2003, MIT Press, Journal of Machine Learning Research, vol. 3 Special Edition, pp. 1059-1082.

Cover et al. "Elements of Information Theory" Copyright Jon Wiley & Sons, Inc., p. 96, 1991.

Czerepinski et al., "Matching Pursuits Video Coding: Dictionaries and Fast Implementation" IEEE Trans Circuit Systems Video Technology, vol. 10, No. 7, pp. 1103-1115, Oct. 2000.

Daubechies, "Orthonormal Bases of Compactly Supported Wavelets" Comm. Pure Appl. Math., vol. 41 pp. 909-996, 1998.

De Natale, et al., "A Mesh-Interpolation Scheme for Very-Low Bitrate Coding of Video Sequences" European Transactions on Telecommunications, vol. 9, No. 1, pp. 47-55, 1998.

De Vleeschouwer et al., "Subband dictionaries for low-cost matching pursuits of video residues," IEEE Transactions on Circuits and Systems for Video Technology, vol. 9, Issue 7, pp. 984-993, Oct. 1999.

Figueras et al., "Color Image Scalable Coding with Matching Pursuit" IEEE Int. Conference Acoustics Speech Signal Process, pp. III-53-III-56, May 2004.

Frossard et al., "High Flexibility Scalable Image Coding" Proceedings of VCIP 2003, Jul. 2003.

Gamito et al. "Lossles Coding of Floating Point Data with JPEG 2000 Part 10" Proceedings of the SPIE, SPIE, Bellingham, VA, US. vol. 5558, Aug. 2, 2004. pp. 276-287.

Golomb, S.W., "Run-length encodings" IEEE Trans Info Theory, Jul. 1966, 12(3):399-401.

Horst et al. "Mupcos: A multi-purpose coding scheme" Signal Processing: Image Communication 5, pp. 75-89, 1993.

Hosang, M., "A Character Elimination Algorithm for Lossless Data Compression" Data Compression Conference, Proceedings. DCC, IEEE Computer Society Press, Los Alamitos, CA, US, Apr. 2, 2002, pp. 1-10.

Huffman, David A., "A Method for the Construction of Minimum-Redundancy Codes," Pro. Inst. Radio Eng., 1952, 9 (40), pp. 1098-1101.

Hull, Jonathan J., "Document Image Matching and Retrieval with Multiple Distortion-Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Jun-peng Bao et al., "A new text feature extraction model and its application in document copy detection" Machine Learning and Cybernetics, 2003, International Conference on Nov. 2-5, 2003 Piscataway, NJ, USA, IEEE, vol. 1, Nov. 2, 2003, pp. 82-87.

Larsson, N.J., "The Context Trees of Block Sorting Compression" In Proceedings of the IEEE Data Compression Conference, Snowbird, Utah, Mar. 30-Apr. 1, pp. 189-198. IEEE Computer Society Press, 1998.

Mallat et al., "Matching Pursuits with Time-Frequency Dictionaries" IEEE Trans. Signal Processing, vol. 41. No. 12, pp. 3397-3415, Dec. 1993.

Mallat, "A Theory for Multiresolution Signal Decomposition: The Wavelet Representation" IEEE Trans. Pattern Anal. Mach. Intel., vol. 11, No. 7, Jul. 1989.

Monro et al., "Alignment Blur in Coherently Averaged Images" IEEE Transactions on Signal Processing, vol. 4, No. 6, pp. 1596-1601, Jun. 1996.

Monro et al., "Based for Low Complexity Matching Pursuits Image Coding" Dept. of Electron. & Electr. Eng., Bath Univ., UK, 2005. IEEE International Conference on Image Processing, Publication Date: Sep. 11-14, 2005. vol. 2, pp. 249-252.

Monro et al., "Improved Coding of Atoms in Matching Pursuits" IEEE Int. Conference. Image Processing, vol. 2, Sep. 2003.

Monro et al., "Visual Embedding of a Wavelet Transformation Coefficients" IEEE International Conference Image Process, pp. 186-189, Sep. 2000.

Monro, "Basis Picking for Matching Pursuits Image Coding" IEEE International Conference on Image Processing, pp. 2495-2498, Sep. 2004.

Moschetti et al., "New Dictionary and Fast Atom Searching Method for Matching Pursuit Representation of Displaced Frame Difference" IEEE International Conference on Image Processing, pp. II-685-II-688, Sep. 2002.

Neff et al., "Matching Pursuit Video Coding-Part I: Dictionary Approximation" IEEE Trans. Circuits System Video Technology, vol. 12, No. 1, pp. 13-26, Jan. 2002.

Neff et al., "Very Low Bit-Rate Video Coding Based on Matching Pursuits" IEEE Trans. Circuits and Systems for Video Tech., vol. 7, No. 1, pp. 158-171, Feb. 1997.

Poh et al., "Comparison of Residual Compression Methods in Motion Compensated Video" IEEE Int. Workshop on Multimedia Signal Processing, pp. 109-112, Dec. 2002.

R. F. Rice, "Some Practical Universal Noiseless Coding Techniques," Jet Propulsion Laboratory, Pasadena, California, JPL Publication 79-22, Mar. 1979.

Ramchandran et al., "Best Wavelet Packet Bases in a Rate-Distortion Sense" IEEE Transactions on Signal Processing, vol. 2, No. 2, pp. 160-175, Apr. 1993.

Said et al., "A New, Fast, and Efficient Image Codec Based on Set Partitioning in Heirarchical Trees" IEEE Transactions on Circuits and Systems for Video Technology, vol. 6, No. 3, pp. 243-250, Jun. 1996.

Sayood, Khalid, "Introduction to Data Compression" Morgan Kaufmann Publishers Inc., San Francisco, CA, USA 1996, pp. 27-32.

Sayood, Khalid, "Introduction to Data Compression" Morgan Kaufmann Publishers Inc., San Francisco, CA, USA 1991, pp. 98-99.

Salomon, "Data Compression: the complete reference", Springer, pp. 32-33, 1998.

Schleimer et al., Data security protection: Winnowing: local algorithms for document fingerprinting, 2003 ACM SIGMOD international conference on Management of data (SIGMOD '03), ACM Press, Jun. 2003, pp. 76-85.

Shapiro, "Embedded Image Coding Using Zerotrees of Wavelet Coefficients" IEEE Transactions on Signal Processing, vol. 41, No. 12, pp. 3445-3462, Dec. 1993.

Steffen et al., "Theory of Regular M-band Wavelets Bases" IEEE Transactions on Signal Processing, vol. 41. No. 12, pp. 3497-3511, Dec. 1993.

Teuhola, J. "A Compression Method for Clustered Bit-Vectors" Information Processing Letters, Amsterdam, NL, vol. 7, No. 6, pp. 308-311, Oct. 1978.

Tian et al., "Image Data Processing in the Compressed Wavelet Domain" Proceedings of ICSP'96, pp. 978-981, 1996.

Tredwell et al., "A Sequential Vector Selection Algorithm for Controllable Bandwidth Motion Description Encoding" IEEE Sympos. Intell. Multimedia. Video & Speech Process, May 2001.

Trott et al. "Wavelets Applied to Lossless Compression and Progressive Transmission of Floating Point Data in 3-D Curvilinear Grids" IEEE Proceedings of the Visualization Conference, Oct. 27, 1996, pp. 385-388.

Yuan et al., "Improved Matching Pursuits Image Coding" IEEE International Conference on Acoustics, Speech and Signal Processing ICASSP 2005, pp. II-201-II-204, Mar. 2005.

Yuan et al., "Low Complexity Separable Matching Pursuits" IEEE Int. Conference Acoustics Speech Signal Process, pp. III-725-III-728, May 2004.

Donald Monro, U.S. Appl. No. 11/677,515, filed Feb. 21, 2007, entitled "Hierarchical Update Scheme for Extremum Location with Indirect Addressing".

Donald Monro, U.S. Appl. No. 11/678,004, filed Feb. 22, 2007, entitled, "Video Coding With Motion Vectors Determined By Decoder".

Donald Monro, U.S. Appl. No. 11/678,479, filed Feb. 23, 2007, entitled, "Video Coding With Embedded Motion".

Donald Monro, U.S. Appl. No. 11/777,256, filed Jul. 11, 2007.

Donald Monro, U.S. Appl. No. 11/677,511, filed Feb. 21, 2007, entitled "Hierarchical Update Scheme For Extremum Location".

Donald Monro, U.S. Appl. No. 11/777,239, filed Jul. 12, 2007.

Donald Monro, U.S. Appl. No. 11/777,230, filed Jul. 12, 2007.

Donald Monro, U.S. Appl. No. 11/777,130, filed Jul. 12, 2007.

Donald Monro, U.S. Appl. No. 11/777,144, filed Jul. 12, 2007.

Donald Monro, U.S. Appl. No. 11/777,122, filed Jul. 12, 2007.

Donald Monro, U.S. Appl. No. 11/777,100, filed Jul. 12, 2007.

Donald Monro, U.S. Appl. No. 11/777,081, filed Jul. 12, 2007.

Donald Monro, U.S. Appl. No. 11/777,022, filed Jul. 12, 2007.

Donald Monro, U.S. Appl. No. 11/776,786, filed Jul. 12, 2007.

Donald Monro, PCT Serial No. PCT/US2007/008861, filed Apr. 9, 2007, entitled "Motion Assisted Data Enhancement".

Donald Monro, PCT Serial No. PCT/US2008/002100, filed Feb. 19, 2008, entitled "Hierarchical Update Scheme For Extremum Location".

Donald Monro, PCT Serial No. PCT/US2008/002101, filed Feb. 19, 2008, entitled "Hierarchical Update Scheme for Extremum Location with Indirect Addressing".

International Search Report for Appln. No. PCT/US2007/013100 issued Jan. 14, 2008, 4pgs.

International Search Report for Appln. No. PCT/US2007/000759 issued Feb. 14, 2008, 7pgs.

International Search Report for Appln. No. PCT/US2007/014138 issued Oct. 29, 2007, 2 pgs.

International Search Report for Appln. No. PCT/US2007/014182 issued Jan. 18, 2008, 1 pg.

International Search Report for Appln. No. PCT/US2007/014181 issued Jan. 14, 2008.

Non-Final Office Action for U.S. Appl. No. 11/255,090, completed Feb. 2, 2008, mailed Feb. 6, 2008, 14pgs.

Non-Final Office Action for U.S. Appl. No. 11/332,777, completed Dec. 12, 2007, mailed Dec. 21, 2007, 4pgs.

Final Office Action for U.S. Appl. No. 11/425,142, completed Sep. 10, 2007, mailed Sep. 18, 2007, 9 pgs.

Non-Final Office Action for U.S. Appl. No. 11/425,142, completed Mar. 7, 2007, mailed Mar. 20, 2007, 8 pgs.

Non-Final Office Action for U.S. Appl. No. 11/470,611, completed Aug. 29, 2007, mailed Sep. 5, 2007, 6 pgs.

Written Opinion for Appln. No. PCT/US2007/000759 completed Feb. 14, 2007, mailed Feb. 25, 2008, 11pgs.

International Search Report for Appln. No. PCT/US2007/019034 issued Apr. 8, 2008, 2pgs.

Written Opinion for Appln. No. PCT/US2007/019034 completed Mar. 31, 2008, mailed Apr. 8, 2008, 7pgs.

Non-Final Rejection for U.S. Appl. No. 11/470,611, mailed on Jun. 30, 2008, 5 pgs.

Non-Final Rejection for U.S. Appl. No. 11/422,316, mailed on Jul. 3, 2008, 7 pgs.

Final Office Action for U.S. Appl. No. 11/332,777 mailed Aug. 13, 2008, 5 pgs.

Final Office Action for U.S. Appl. No. 11/255,090 mailed Sep. 3, 2008, 11 pgs.

Non-Final Office Action for U.S. Appl. No. 11/425,142, mailed Sep. 16, 2008, 12 pgs.

Choog Soo Park et al., "Lost Motion Vector Recovery Algorithm," Circuits and Systems, IEEE International Symposium on London, vol. 3, 1994, pp. 229-232.

International Search Report for Appln. No. PCT/US2008/002179, issued Aug. 20, 2008, 12 pgs.

Non-Final Office Action for U.S. Appl. No. 11/255,090, dated Dec. 15, 2008, 11 pgs.

International Search Report and Written Opinion for Appln. No. PCT/US2008/002101, dated Dec. 12, 2008, 13 pgs.

Cotter et al., "Application of Tree-Based Searches to Matching Pursuit," 2001 IEEE International Conference on Acoustics, Speech and Signal Processing, New York, NY, vol. 6, 7, May 2001, pp. 3933-3936.

Shoa et al., "Tree Structure Search for Matching Pursuit," Image Processing, 2005, vol. 3, 11, pp. 908-911.

Qiangsheng Liu et al., "A low-cost video encoder with matching pursuit," Intelligent Multimedia, Video and Speech Processing, May 2, 2001, pp. 502-505.

Yuan Yuan et al., "Improved Matching Pursuits Image Coding," Acoustics, Speech, and Signal Processing, 2005, vol. 2, 18, pp. 201-204.

International Search Report and Written Opinion for Appln. No. PCT/US2008/002100, dated Dec. 12, 2008, 14 pgs.

International Search Report for Appln. No. PCT/US2007/021302, dated Dec. 10, 2008, 5 pgs.

Haoxing Zhang et al., "A Hybrid Video Coder Based on H.264 with Matching Pursuits," Acoustics, Speech and Signal Processing, 2006, p. 889.

Yuan et al., "3D Wavelet Video Coding with Replicated Matching Pursuits," Sep. 11, 2005, Image Processing, pp. 69-72.

Monro et al., "Subband Adaptive Dictionaries for Wavelet/Matching Pursuits Image Coding," Oct. 8, 2006, Image Processing, p. 2136.

Chien-Kai et al., "Matching Pursuits Low Bit Rate Video Coding with Codebooks Adaptation," Jun. 5, 2000, Acoustics, Speech, and Signal Processing, pp. 408-411.

International Search Report for Appln. No. PCT/US2007/019297, dated Dec. 12, 2008, 5 pgs.

Non-Final Office Action for Appln. No. 11/255,090, mailed Dec. 15, 2008, 15 pgs.

Non-Final Office Action for Appln. No. 11/332,777, mailed Feb. 25, 2009, 6 pgs.

Final Office Action for Appln. No. 11/425,142, mailed Mar. 2, 2009, 18 pgs.

International Search Report for Appln. No. PCT/US2007/014181 issued Jan. 23, 2008, 1 pg.

David Salomon, "Data Compression: The Complete Reference," 1998, Springer, XP002464409, pp. 32-33.

Non-Final Office Action for U.S. Appl. No. 11/677,511, mailed Feb. 20, 2009, 23 pgs.

Non-Final Office Action for U.S. Appl. No. 11/677,515, mailed Feb. 25, 2009, 21 pgs.

International Preliminary Report on Patentability and Written Opinion for Appln. No. PCT/US2007/021302 completed Apr. 7, 2009, mailed Apr. 16, 2009, 9 pgs.

International Preliminary Report on Patentability and Written Opinion for Appln. No. PCT/US2007/021303 completed Apr. 7, 2009, mailed Apr. 16, 2009, 9 pgs.

Non-Final Office Action for U.S. Appl. No. 11/399,753, mailed Jun. 1, 2009, 13 pgs.

* cited by examiner

DATA CODING USING AN EXPONENT AND A RESIDUAL

FIELD

The present patent application relates to data coding, such as, for example, Golomb coding.

BACKGROUND

As is well-known, efficient data coding for storage or transmission continues to be an area in which new approaches are sought. For example, if data may be coded more efficiently, such as by compression, the amount of memory to store data to be coded may be reduced. Likewise, in communications systems, if data may be coded efficiently, for a communications channel of a given bandwidth, for example, potentially more information may be transmitted in a given unit of time. These goals and many others may be the object of methods for efficient coding of data.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
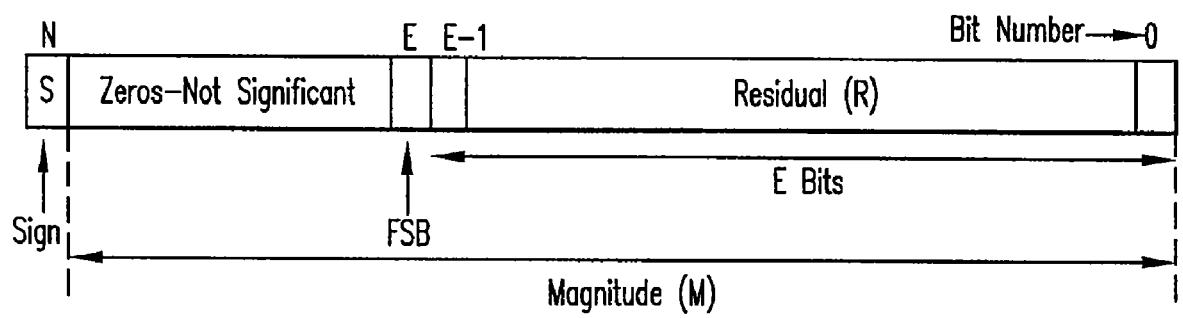
FIG. 1 is a schematic diagram illustrating one embodiment of a technique for data coding.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

As previously alluded to, one potential, although not exclusive, application of an embodiment of claimed subject matter may be in the field of low bit rate audio and/or video coding. It is typically desirable in this particular field, for example, to compress data relatively efficiently. In this and analogous fields, it may also be desirable, as suggested previously, to transmit information across a communications channel, such as a channel that may be subject to restrictions on the number of bits that may be transmitted, or on the bit transmission rate. Therefore, relatively efficient coding may result in more information being transmitted per unit time, for example. Another application, also previously suggested, may be in the compression of data on an electronic device, such as for storage in files, for example. This may, for example, reduce the amount of memory for storage of the particular data, for example, or, as another example, facilitate transmission of the data by reducing the size of an attachment to an email. Of course, claimed subject matter is not limited to these simple examples. These are provided simply for purposes of illustration.

Golomb coding is well-known and described in Golomb, S W: 'Run-length encodings', IEEE Trans. Inf. Theory, 1966, 7, (12), pp. 399-401. Golomb Codes are simply one example of data coding. Therefore, while many of the examples described later are presented in terms of Golomb coding, it should be clear that it is intended that claimed subject matter not be limited in scope simply to Golomb codes (GCs). Other approaches to coding data may be employed and provide satisfactory results. Nonetheless, continuing with Golomb coding as one example, GCs are often used for run length coding, but, in principle, they are general purpose codes that may be used to encode any symbol, or sequence of symbols, as an integer numeral or a sequence of integer numerals. In one possible embodiment, a unique integer numeral may be assigned to a symbol and the symbol may then be coded by Golomb coding the corresponding numeral, for example. GCs have an advantage that the range of numerals need not be known or constrained in advance.

In one particular example, a Golomb Code of a numeral I, modulo K (where K is the 'base' in this example) may be defined by (S, E, R) as follows:

S=the Sign of the numeral I, if appropriate (may be omitted if the numerals are either all positive or all negative).

M=the Magnitude of I

E=the exponent $\text{fix}(\log_K(M))$, where fix( ) denotes here a truncation operation, that is, rounding to the next lowest integer numeral.

$R=M-K^E$, is referred to here as a "residual."

The Magnitude of I, therefore, may be obtained by $M=K^E+R$.

It is noted however, that $\log_K(0)$ may provide a mathematical quirk in that K raised to any power should not provide zero. One approach that may be employed to address this includes adding 1 to all non-negative integer numerals so that $\log_K(0)$ should not occur, although, of course, claimed subject matter is not limited in scope in this respect.

At times, out of convenience, for example, K=2, so that a Golomb Code, for example, may provide a form of binary floating point representation of variable length, with exponent E and residual R of variable length E bits. This case is illustrated in FIG. 1, for example, although claimed subject matter is not limited in scope in this respect, of course.

As shall be described in more detail below, in one embodiment, a method of coding a data symbol may be employed, comprising Golomb-coding, although, as explained previously, claimed subject matter is not limited in scope to Golomb coding. In such an embodiment, a symbol may be Golomb-coded by an exponent value E and a residual value R, the exponent value being coded substantially according to a variable length code, again, as described in more detail below.

In this particular embodiment, for example, a Variable Length Code (VLC) may be employed to make substitutions for symbols in which short codes may be used for more frequently occurring symbols and longer codes for less frequently occurring symbols. In this way, the average length of a code may be reduced. One well-known example of a VLC comprises Huffman coding, although many other examples exist. For example, Fano/Shannon coding comprises a VLC, as does the Morse code, which substitutes short codes for frequently occurring letters like E (one dot) and longer ones for others like X (dash dot dot dash). Of course, claimed subject matter is not limited in scope to these examples. These are provided merely for purposes of illustration.

Likewise, another embodiment may comprise a method of coding a symbol by a corresponding positive non-zero numeral V. The largest integral value of an exponent E for which $b^E$ does not exceed V, where b is an integer numeral modulo value, and $E=fix(\log_b(V))$, may be determined. Likewise, a residual $R=V-b^E$ may be calculated. A symbol code may therefore be generated that includes the value of an exponent, coded as a variable length code, and a residual value. Of course, claimed subject matter is not limited in scope to this particular embodiment. This is simply one example of an embodiment included within the scope of claimed subject matter.

Various modifications are possible and all are intended to be included within the scope of claimed subject matter. For example, in one alternate embodiment, the symbols may optionally be contained within a symbol alphabet which ranks symbols by expected probability of occurrence, the value of V representing the symbol rank.

Likewise, in one embodiment, a Variable Length Coder (VLC), such as, for example, a Huffman Coder, may encode the exponent of a code, such as a Golomb Code, for example, for efficiently coding and compressing a stream of symbols. However, the VLC may be adaptive or static, depending, for example, on the particular embodiment.

Although claimed subject matter is not limited in scope in this respect, it is noted that embodiments of a coding procedure as described herein may at times out perform Huffman Coding in real applications. Likewise, while claimed subject matter is not limited in scope in this respect, embodiments may be conveniently applied to run length coding and/or for use with awkward probability distributions, although these are merely examples, and claimed subject matter is not limited in scope in this respect.

Example embodiments, in addition to an embodiment of a method of coding of data, may include a computer program incorporating such a method; and/or a coder, such as one implemented in hardware, firmware, software, or combinations therefore. Embodiments may also include video and/or audio codecs embodying such a method; video and/or audio compression systems whereby data may be encoded according to such a method, and in which such data may then be transmitted across a communications channel for reconstruction by a decoder at the far end. Alternatively, the coded data may be stored rather than transmitted. These and many other embodiments are included within the scope of claimed subject matter.

FIG. 1, for example, shows an embodiment of a Golomb-coded N bit fixed point binary numeral, using sign and magnitude representation. The leading bit S (which may be omitted in an alternate embodiment) indicates the sign. This is followed by a number of non-significant leading zeros. The first significant bit (FSB) occurs at location E, with the location of the FSB thereby indicating the value of the exponent. The remaining bits are represented by the subsequent E bits, this being known as the "residual" R in this context. The magnitude M of the numeral, in this representation, is simply the value of the binary numeral represented by the N bits labelled 0 to N-1.

Here, sign=1 or 0

Likewise, Magnitude=$M=\Sigma 2^n b_n$ where $b_n$ is the value of bit n, 0 or 1, and the summation runs from n=0 to N.

E=Position of $FSB=fix(\log_2 M)$ for $M>=1$

R=Residual=$M-2^E$ which has E bits for E>=1 and M>=2.

Given the representation of FIG. 1, to transmit data across a communications channel, one may, in this embodiment, send values of S (if appropriate) along with a positional value E and a value of a residual R. Typically, the residual value is not encoded, and the bits are simply sent one by one, as they are. However, entropy coding of a residual may be employed in some embodiments, of course, A value of E may, in some situations, be challenging to transmit, in that the number of bits to transmit E may typically be variable, as is the number of bits to send a residual. A common way of implementing a Golomb coder is to transmit not the value of E but, instead, the change in E with respect to the last value that was sent. For example, the sending of a first symbol may indicate that the value of E has increased by 1, whereas the sending of a second symbol may indicate that the value has decreased by 1. The sending of a third symbol may indicate that the value of E remains the same. The differences between the successive values of E may, in practice, be transmitted as successive bits, although claimed subject matter is not limited in scope in this respect. Further details may be found, for example, in Rice, R F: 'Some practical universal noiseless coding techniques', *Tech. Rep. JPL-79-22*, Jet Propulsion Laboratory, Pasadena, Calif., March 1979. Huffman Coding is also a well-known method of coding data, details of which may be found in Huffman, D.: 'A method for the construction of minimum redundancy codes', *Proc. Inst. Radio Eng.*, 1952, 9, (40), pp. 1098-1101.

In the binary case, if the maximum value of E that may occur is Max_E, the uncoded representation of all values from 0 to Max_E employs 1+fix($\log_2$ Max_F) bits. Since it is a feature of a Golomb Code that we do not necessarily know the range of numerals, it follows that we do not necessarily know the size of Max_E. Once E is known for a particular numeral, however, it is then known that the value of R employs E bits.

Golomb Coding, as an example, embodiment, works well at least in part because the probability density of R is normally relatively flat, even in cases where the probability density of M is uneven or skewed. The skewness of the distribution will be largely represented in the distribution of E, although even that is generally well-behaved. There is a smoothing effect on E because any value of E which is greater than 1 covers a range of $2^E$ different values of M. There is a flattening effect on R because the number of values of R is less than the number of possible values of M. One aspect of this particular embodiment relates to recognizing that the efficient operation of a coder is dependent at least in part on the "cost" of coding E. Therefore, a reduction in this cost may be desirable. For example, if the range of E is constrained, say 1<E<Max_E, it may be acceptable to code E by the binary numeral E-1 of 1+fix($\log_2$(Max_E-1)) bits. In this context, we define a method of coding E simply by its bits as a Raw Code. Furthermore, if K and Max_E are both powers of 2, this may produce good results, although claimed subject matter is, of course, not limited in scope in this respect.

A comparative example may serve to show that employing a Raw Code, such as a Raw Golomb Code, may provide a reasonable technique for coding data. Suppose we wish to transmit a sequence of numerals, and that all numerals from 1 to 8 are equally likely with no correlation between successive numerals. Effectively, this is like the outcome of throwing a dice of 8 sides. One way of coding and transmitting such data is to use a Variable Length Coder (VLC), such as a Huffman coder.

As is well-known, the theoretical cost of coding, or the entropy, of this sequence of numerals is $\log_2 8=3$ bits and simply sending the value as three bits is an optimum code. In theory, a well-constructed VLC, such as a Huffman coder, would recognize this and also produce the optimum code. However in practice, this may not occur, such as if the VLC is adaptive and is forming its codes from real sequences of numerals which are not likely to have a flat observed histogram of occurrence. Thus, it may be possible, for example, that a VLC will assign the symbols as having different probabilities and so assign a 1-bit code to the one the coder determines is most common, a 2-bit code to the next, and so on. In this example, we can suppose that the numerals from 1 to 7 have 1 to 7 bits, and we may code the value 8 by 7 bits as well. In this case, the VLC will on average use 1/8(1+2+3+4+5+6+7+7) bits, here 35/8=4.375 bits, nearly 46% greater than the optimum. It is not generally appreciated that a Huffman coder may at times perform so badly.

A Raw Golomb Code, on the other hand, will do better in transmitting the same sequence of numerals. The range of E in this case is 0-3, which we may communicate with 2 bits.

We can list the number of bits employed for the 8 possible numerals:

| Value | E | E Bits | R | R Bits | Total Bits |
|---|---|---|---|---|---|
| 1 | 0 | 2 | — | 0 | 2 |
| 2 | 1 | 2 | 0 | 1 | 3 |
| 3 | 1 | 2 | 1 | 1 | 3 |
| 4 | 2 | 2 | 0 | 2 | 4 |
| 5 | 2 | 2 | 1 | 2 | 4 |
| 6 | 2 | 2 | 2 | 2 | 4 |
| 7 | 2 | 2 | 3 | 2 | 4 |
| 8 | 3 | 2 | 0 | 0 | 2 |

This code will, on average, use 26/8 bits, here about 8% over the optimum. If we say we do not know in advance that 8 is the maximum numeral, one may allow for a 4-bit residual if 8 occurs. Then, the average is 30/8 bits, or 25% over the optimum. Nonetheless, as this example demonstrates, a Raw Golomb code here performs better than a Huffman code.

Some inefficiency in a Raw Golomb code may be attributed to coding of E in a manner which employs 2 bits to code a value even if different values of E do not occur with the same frequency. Instead, for this particular embodiment, we propose use of a VLC to code values of E. A Variable Length Coder (VLC) typically uses an alphabet of symbols in which the probabilities of occurrence of the symbols are ranked in numerical order. One well-known coder of this type is the Huffman Coder, mentioned above. Other VLCs, apart from Huffman, may likewise be used.

Continuing with the previous example, the most common value of E is 2, so we use the shortest code, binary 1. Similarly, the binary code for E=1 is 01, and the binary codes for E=0 and E=3 are either 001 or 000, either way around. It is also possible to switch the roles of the binary values 0 and 1 in the coding of E. These may be recognized as Huffman codes for E with the choice of 000 and 001 to code the values 1 and 8 being arbitrary.

The efficiency is now:

| Value | E | E (Binary) | E Bits | R | R Bits | Total Bits |
|---|---|---|---|---|---|---|
| 1 | 0 | 001 | 3 | — | 0 | 3 |
| 2 | 1 | 01 | 2 | 0 | 1 | 3 |
| 3 | 1 | 01 | 2 | 1 | 1 | 3 |
| 4 | 2 | 1 | 1 | 0 | 2 | 3 |
| 5 | 2 | 1 | 1 | 1 | 2 | 3 |
| 6 | 2 | 1 | 1 | 2 | 2 | 3 |
| 7 | 2 | 1 | 1 | 3 | 2 | 3 |
| 8 | 3 | 000 | 3 | 0 | 0 | 3 |

We define a 'Hybrid Golomb Coder' (HGC) to be a Golomb code in which a Huffman VLC is used to code for a value of E. The example above shows that a HGC is optimal in this case. In forming this code, we have exploited the fact that no R value is employed for either 0 or 8. If E is 0, there is, of course, no residual, and, if E is 3, the numeral being transmitted is 8, once again with no residual. We have also assumed that the Huffman codes for E=0 and E=3 have correctly been seen to be equal.

To make a comparison with a practical Huffman Coder, instead, which may be adaptive, we might recognize that one or the other of the E values for 0 or 8 might use a 4-bit code. We also might not know in advance that the maximum is 8, another reason for using a 4-bit code for one symbol. In both of these cases, on average, 25/8 bits would be used, which is only 4% more than the optimum.

We may also make a comparison with a case in which a Huffman coder is known to be optimal, such as if the probabilities of our 8 symbols are ½, ¼, … ¹⁄₁₂₈, ¹⁄₁₂₈. The last two probabilities are the same in order that the probabilities sum to 1.0. The theoretical entropy of a stream of symbols from such a source is 1.9844 bits per symbol, and a Huffman Coder, on average, achieves this precisely.

For this embodiment of a Hybrid Golomb Coder (HGC), we tabulate, and apply the probabilities to get the average performance. Note that we assume the ranks of the E values are properly identified.

| Symb | Prob | E (Binary) | E Bits | R | R Bits | Total Bits | Av Bits |
|---|---|---|---|---|---|---|---|
| 1 | 1/2 | 1 | 1 | — | 0 | 1 | 0.5 |
| 2 | 1/4 | 01 | 2 | 0 | 1 | 3 | 3/4 |
| 3 | 1/8 | 01 | 2 | 1 | 1 | 3 | 3/8 |

-continued

| Symb | Prob | E (Binary) | E Bits | R | R Bits | Total Bits | Av Bits |
|------|------|-----------|--------|---|--------|------------|---------|
| 4 | 1/16 | 001 | 3 | 0 | 2 | 5 | 3/16 |
| 5 | 1/32 | 001 | 3 | 1 | 2 | 5 | 3/32 |
| 6 | 1/64 | 001 | 3 | 2 | 2 | 5 | 3/64 |
| 7 | 1/128 | 001 | 3 | 3 | 2 | 5 | 3/128 |
| 8 | 1/128 | 0001 | 4 | 0 | 0 | 4 | 4/128 |

The average number of bits used is 2.0078, and this is just over 1% worse than the 1.9844 bits of the Huffman code, even if the Huffman code is optimal.

Over a range of probabilities, experimentation shows that a Hybrid Golomb Coder using a Huffman VLC to code the values of E consistently outperforms a Huffman Coder, except in situations relatively close to ideal operating conditions for a Huffman Coder.

As was explained above, one common way of implementing a traditional Golomb Coder is not to transmit values of E themselves, but, instead, to transmit changes to values of E. Although this might be preferred under some very narrow conditions, where successive values are correlated, both theory and experimental results show that a Hybrid Golomb Coder generally outperforms such a traditional Golomb Coder. For example, in Run Length Coding, successive E values are often anti-correlated, e.g., a large run may be followed by a short one, and so a traditional Golomb Coder may be chasing the E value "back and forth," while a HGC may select a better code for E most of the time.

It will, of course, be understood that in encoding a value of E it is not essential that a Huffman process be used. Any variable length code could be used instead, such as a fixed (predefined) code or, alternatively, an adaptive code in which the values are determined according to measured probabilities of the numerals or symbols found within the data to be transmitted. Of course, these are merely examples and claimed subject matter is not limited in scope to these examples.

Embodiments in accordance with claimed subject matter may be applied to coding of data of all types, including non-numeric data, such as symbolic data, for example, converted into numerical form by any convenient mapping prior to application of coding. As is noted, embodiments perform well for run length coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

It will, of course, be understood that, although particular embodiments have just been described, the claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive.

Figure 2:
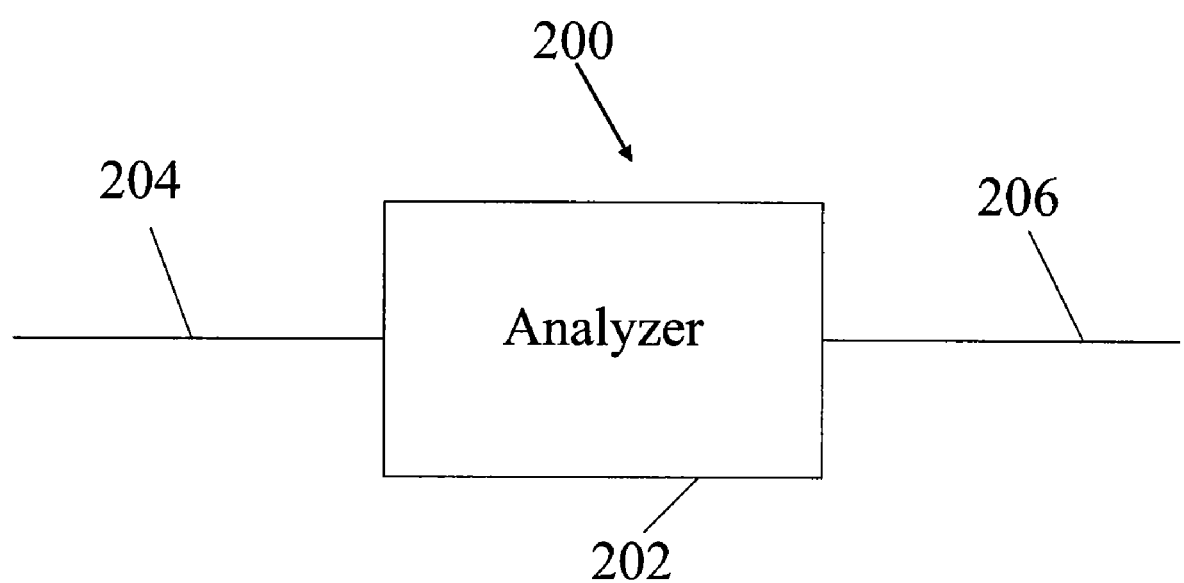
FIG. 2 illustrates an exemplary system.
Figure 2:
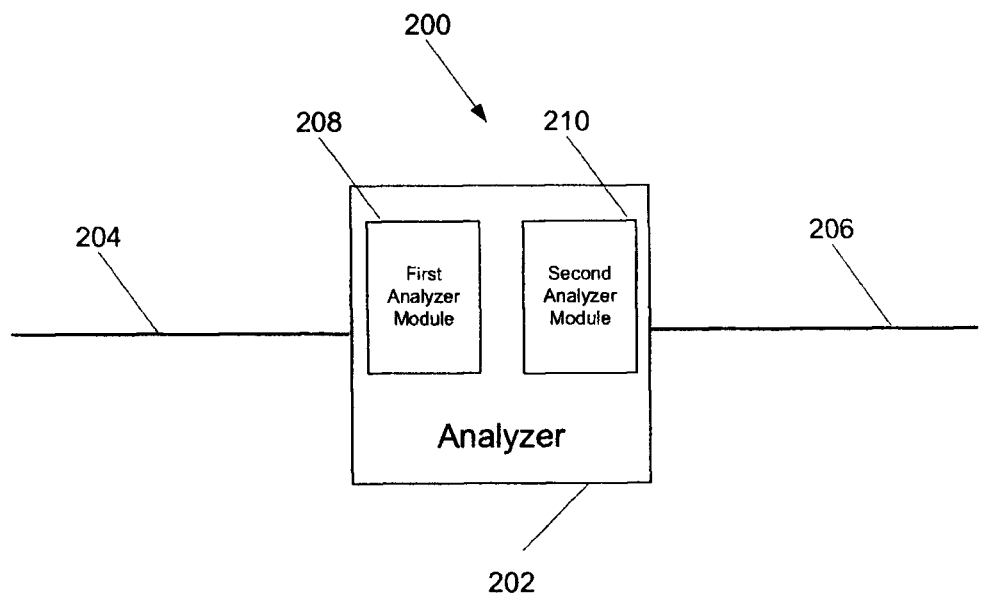

FIG. 2 illustrates a system 200. System 200 includes an analyzer 202. Analyzer 202 receives data 204 and produces coded data 206 therefrom. The analyzer 202 can comprise a first analyzer module 208 and a second analyzer module 210. As discussed above, analyzer 200 can be a combination of hardware, software, and/or firmware.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method comprising:
coding a data symbol using a code comprising an exponent value and a residual value;
coding the residual value using a fixed-length binary code; and
coding the exponent value using a variable length code that is based on a frequency of occurrence of the exponent value.

2. The method of claim 1, wherein the data symbol comprises a binary representation.

3. The method of claim 1, wherein the data symbol is run length encoded.

4. The method of claim 1, further comprising:
coding additional data symbols from a sequence of data symbols.

5. The method of claim 4, wherein the sequence of data symbols represents an audio and/or a video stream.

6. The method of claim 4, wherein the sequence of data symbols are included within a symbol alphabet, which ranks each symbol in the sequence according to expected probability of occurrence.

7. The method of claim 1, wherein the coding of the data symbol comprises Raw Golomb coding.

8. The method of claim 1, wherein the data symbol comprises non-numeric data.

9. The method of claim 1, wherein the data symbol is an audio signal, a video signal, a data signal, or a file.

10. The method of claim 1, further comprising:
using one of Huffman coding, Fano-Shannon coding, or Golomb coding as the variable length code.

11. The method of claim 1, wherein the variable length code is adaptive.

12. The method of claim 1, wherein the variable length code comprises a pre-defined code.

13. The method of claim 1 wherein values of the variable length code are further determined according to a probability of the data symbol or frequency of occurrence of the data symbol.

14. A method comprising:
coding a data symbol using a code comprising an exponent value and a residual value; and
coding the residual value using entropy encoding.

15. The method of claim 14, wherein the data symbol comprises a binary representation.

16. The method of claim 14, wherein the data symbol is run length encoded.

17. The method of claim 14, further comprising:
coding additional data symbols from a sequence of data symbols.

18. The method of claim 17, wherein the sequence of data symbols represents an audio and/or a video stream.

19. The method of claim 17, wherein the sequence of data symbols are included within a symbol alphabet, which ranks each symbol in the sequence according to expected probability of occurrence.

20. The method of claim 14, wherein the coding of the data symbol comprises Raw Golomb coding.

21. The method of claim 14, wherein the data symbol comprises non-numeric data.

22. The method of claim 14, wherein the data symbol is an audio signal, a video signal, a data signal, or a file.

23. The method of claim 14, further comprising:
coding the exponent value using a variable length code.

24. The method of claim 23, further comprising:
using one of Huffman coding, Fano-Shannon coding, or Golomb coding as the variable length code.

25. The method of claim 23, wherein the variable length code is adaptive.

26. The method of claim 23, wherein the variable length code comprises a pre-defined code.

27. The method of claim 23, wherein values of the variable length code are determined according to a probability of the data symbol or frequency of occurrence of the data symbol.

28. A tangible computer-readable medium having stored thereon, computer-executable instructions that, if executed by a computing device, cause the computing device to perform a method comprising:
coding a data symbol using a code comprising an exponent value and a residual value;
coding the residual value using a fixed-length binary code; and
coding the exponent value using a variable length code that is based on a frequency of occurrence of the exponent value.

29. A tangible computer-readable medium having stored thereon, computer-executable instructions that, if executed by a computing device, cause the computing device to perform a method comprising:
coding a data symbol using a code comprising an exponent value and a residual value; and
coding the residual value using entropy encoding.

30. A system comprising:
a first analyzer module configured to code a data symbol using a code comprising an exponent value and a residual value; and
a second analyzer module configured to code the residual value using a fixed-length binary code and code the exponent value using a variable length code that is based on a frequency of occurrence of the exponent value,
wherein the first and second analyzer modules execute in one or more computers.

31. A system comprising:
a first analyzer module configured to code a data symbol using a code comprising an exponent value and a residual value; and
a second analyzer module configured to code the residual value using entropy encoding,
wherein the first and second analyzer modules execute in one or more computers.

32. A system comprising:
means for coding a data symbol using a code comprising an exponent value and a residual value;
means for coding the residual value using a fixed-length binary code; and
means for coding the exponent value using a variable length code that is based on a frequency of occurrence of the exponent value.

33. A system comprising:
means for coding a data symbol using a code comprising an exponent value and a residual value; and
means for coding the residual value using entropy encoding.

34. A method comprising:
coding a data symbol using a code comprising an exponent value and a residual value;
coding the exponent value using a variable-length code; and
coding the residual value using entropy encoding.

* * * * *

UNITED STATES PATENT AND TRADEMARK OFFICE
CERTIFICATE OF CORRECTION

| | | |
|---|---|---|
| PATENT NO. | : 7,586,424 B2 | Page 1 of 2 |
| APPLICATION NO. | : 11/422316 | |
| DATED | : September 8, 2009 | |
| INVENTOR(S) | : Donald Martin Monro | |

It is certified that error appears in the above-identified patent and that said Letters Patent is hereby corrected as shown below:

Drawings:

Delete fig 2: and replace with the following attached fig 2:

Signed and Sealed this
Twelfth Day of July, 2011

David J. Kappos
*Director of the United States Patent and Trademark Office*